(12) United States Patent
Hirata

(10) Patent No.: US 10,714,353 B2
(45) Date of Patent: Jul. 14, 2020

(54) PLANARIZATION METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/244,867

(22) Filed: Jan. 10, 2019

(65) Prior Publication Data

US 2019/0221436 A1    Jul. 18, 2019

(30) Foreign Application Priority Data

Jan. 16, 2018   (JP) .................... 2018-005046

(51) Int. Cl.
| | | |
|---|---|---|
| *H01L 21/00* | (2006.01) | |
| *H01L 21/304* | (2006.01) | |
| *B23K 26/70* | (2014.01) | |
| *B23K 26/0622* | (2014.01) | |
| *B23K 26/08* | (2014.01) | |
| *B24B 7/22* | (2006.01) | |
| *B23K 26/53* | (2014.01) | |
| *B23K 26/00* | (2014.01) | |
| *B24B 27/00* | (2006.01) | |
| *B24B 37/20* | (2012.01) | |
| *C30B 29/36* | (2006.01) | |
| *H01L 21/02* | (2006.01) | |
| *H01L 21/66* | (2006.01) | |
| *B23K 101/40* | (2006.01) | |
| *B23K 103/00* | (2006.01) | |
| *H01L 21/04* | (2006.01) | |

(52) U.S. Cl.
CPC ........ *H01L 21/304* (2013.01); *B23K 26/0006* (2013.01); *B23K 26/0622* (2015.10); *B23K 26/0876* (2013.01); *B23K 26/53* (2015.10); *B23K 26/702* (2015.10); *B24B 7/228* (2013.01); *B24B 27/0076* (2013.01); *B24B 37/205* (2013.01); *C30B 29/36* (2013.01); *H01L 21/02013* (2013.01); *H01L 22/24* (2013.01); *B23K 2101/40* (2018.08); *B23K 2103/52* (2018.08); *H01L 21/0475* (2013.01)

(58) Field of Classification Search
None
See application file for complete search history.

(56) References Cited

U.S. PATENT DOCUMENTS

| | | | | |
|---|---|---|---|---|
| 2007/0042693 | A1* | 2/2007 | Saikin ................. | B24B 37/205 451/527 |
| 2017/0301549 | A1* | 10/2017 | Suzuki ................. | B23K 26/402 |

FOREIGN PATENT DOCUMENTS

| | | |
|---|---|---|
| JP | 2000094221 A | 4/2000 |
| JP | 2016111143 A | 6/2016 |

\* cited by examiner

*Primary Examiner* — Reema Patel
(74) *Attorney, Agent, or Firm* — Greer Burns & Crain, Ltd.

(57) ABSTRACT

A planarization method includes a grinding step of holding the opposite side to a separation surface in an SiC ingot by a rotatable chuck table and rotating a grinding wheel having plural grinding abrasives disposed in a ring manner to grind the separation surface of the SiC ingot held by the chuck table, and a flatness detection step of irradiating the separation surface of the SiC ingot exposed from the grinding wheel with light and detecting reflected light to detect the degree of flatness. The grinding step is ended when that the separation surface of the SiC ingot has become flat is detected in the flatness detection step.

4 Claims, 10 Drawing Sheets

PLANARIZATION METHOD

BACKGROUND OF THE INVENTION

Field of the Invention

The present invention relates to a planarization method for planarizing a separation surface of a silicon carbide (SiC) ingot after a wafer that should be generated is separated.

Description of the Related Art

Devices such as integrated circuits (ICs), large-scale integrated circuits (LSIs), and light emitting diodes (LEDs) are formed through stacking of a functional layer on a surface of a wafer employing silicon (Si), sapphire ($Al_2O_3$), or the like as a material and segmentation by plural planned dividing lines that intersect. Furthermore, power device, LED, and so forth are formed through stacking of a functional layer on a surface of a wafer employing SiC as a material and segmentation by plural planned dividing lines that intersect. For the wafer on which devices have been formed, processing is carried out on the planned dividing lines by cutting apparatus or laser processing apparatus. Thus, the wafer is divided into individual device chips, and the respective divided device chips are used for pieces of electrical equipment such as mobile phones and personal computers.

In general, a wafer on which plural devices are formed is generated by thinly cutting an ingot with a circular column shape by a wire saw. The front surface and back surface of the cut wafer are finished into mirror shapes by being polished (for example, refer to Japanese Patent Laid-open No. 2000-94221). However, when the ingot is cut by the wire saw and the front surface and back surface of the cut wafer are polished, there is a problem that a large part (70 to 80%) of the ingot is discarded and this is uneconomical. In particular, in the case of the SiC ingot, the hardness is high and cutting by the wire saw is difficult and requires a considerable time, and thus the productivity is low. In addition, the unit price of the ingot is high, and the SiC ingot has a problem in efficiently generating the wafer.

Therefore, the present applicant has proposed a technique in which the focal point of a laser beam with such a wavelength as to be transmitted through SiC is positioned inside an SiC ingot and the SiC ingot is irradiated with the laser beam to form a separation layer at a planned cutting plane, and a wafer is separated from the SiC ingot along the planned cutting plane at which the separation layer is formed (for example, refer to Japanese Patent Laid-open No. 2016-111143).

SUMMARY OF THE INVENTION

However, after the wafer is separated from the separation layer, the separation surface of the ingot is rough. Thus, grinding is carried out by a grinding wheel having plural grinding abrasives disposed in a ring manner, and the separation surface of the ingot is made flat. However, there is a problem that it is difficult to detect that the separation surface has become flat and the separation surface is excessively ground, and thus the production efficiency is low.

Thus, an object of the present invention is to provide a planarization method that can avoid excessive grinding of a separation surface of an SiC ingot and shorten the grinding time.

In accordance with an aspect of the present invention, there is provided a planarization method for planarizing a separation surface of an SiC ingot after the focal point of a laser beam with such a wavelength as to be transmitted through SiC is positioned at a depth corresponding to a wafer to be generated from an end surface of the SiC ingot and the SiC ingot is irradiated with the laser beam to form a separation layer in which SiC is separated into Si and C and cracks are isotropically generated along a c-plane and the wafer is separated from the SiC ingot at the separation layer. The planarization method includes a grinding step of holding the opposite side to the separation surface in the SiC ingot by a rotatable chuck table and rotating a grinding wheel having a plurality of grinding abrasives disposed in a ring manner to grind the separation surface of the SiC ingot held by the chuck table, and a flatness detection step of irradiating the separation surface of the SiC ingot exposed from the grinding wheel with light and detecting reflected light to detect the degree of flatness. The grinding step is ended when that the separation surface of the SiC ingot has become flat is detected in the flatness detection step.

Preferably, in the flatness detection step, that the separation surface has become flat is detected when the separation surface is irradiated with the light at an incident angle θ, and the reflected light is received at a reflection angle θ and the amount of received light surpasses a threshold. Preferably, if the wafer to be generated is separated from the separation layer of the SiC ingot in which an off-angle α is formed by the c-plane and the end surface, in the flatness detection step, that the separation surface has become flat is detected when the light is emitted from a light emitting element perpendicularly to the separation surface, the reflected light is received at a position at which an angle formed with the light emitting element is 2α, and the amount of received light falls below a threshold.

According to the present invention, the grinding step is ended when that the separation surface of the SiC ingot has become flat is detected in the flatness detection step. Thus, excessive grinding of the separation surface of the SiC ingot can be avoided and the grinding time can be shortened.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
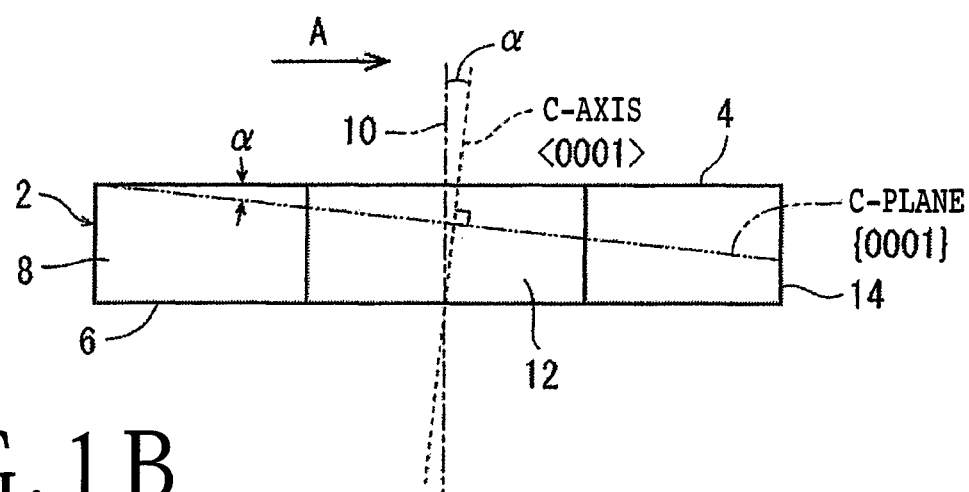
FIG. 1A is a front view of an SiC ingot.
Figure 1B:
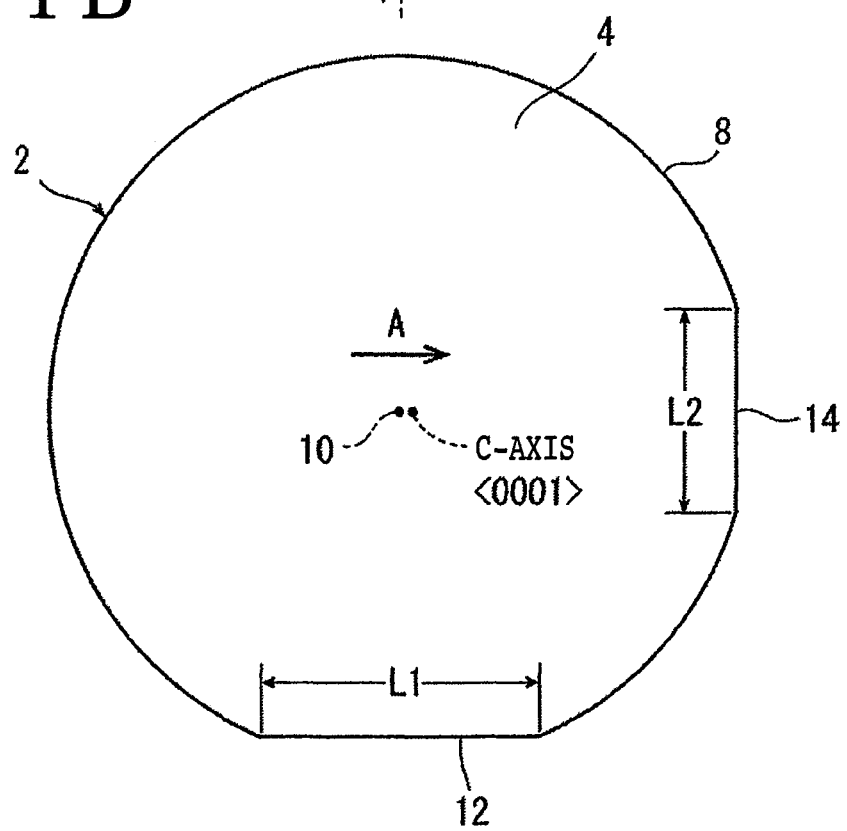
FIG. 1B is a plan view of the SiC ingot.

An embodiment of the planarization method according to the present invention will be described below with reference to the drawings. In FIGS. 1A and 1B, an SiC ingot 2 on which the planarization method according to the present invention can be carried out is depicted. The SiC ingot 2 is formed into a circular column shape as a whole from hexagonal single-crystal SiC and has a first end surface 4 with a circular shape, a second end surface 6 with a circular shape on the opposite side to the first end surface 4, a circumferential surface 8 located between the first end surface 4 and the second end surface 6, the c-axis (<0001> direction) that reaches the second end surface 6 from the first end surface 4, and the c-plane ({0001} plane) orthogonal to the c-axis. In the SiC ingot 2, the c-axis is inclined with respect to a perpendicular 10 to the first end surface 4 and an off-angle α (for example, α=1, 3, or 6 degrees) is formed by the c-plane and the first end surface 4. The direction in which the off-angle α is formed is depicted by an arrow A in FIGS. 1A and 1B. Furthermore, in the circumferential surface 8 of the SiC ingot 2, a first orientation flat 12 and a second orientation flat 14 that depict the crystal orientation and have a rectangular shape are formed. The first orientation flat 12 is parallel to direction A in which the off-angle α is formed and the second orientation flat 14 is orthogonal to direction A in which the off-angle α is formed. As depicted in FIG. 1B, as viewed from above, a length L2 of the second orientation flat 14 is shorter than a length L1 of the first orientation flat 12 (L2<L1). The SiC ingot on which the planarization method according to the present invention can be carried out is not limited to above-described SiC ingot 2 and may be an SiC ingot in which the c-axis is not inclined with respect to the perpendicular to the first end surface and the off-angle α between the c-plane and the first end surface is 0 degrees (that is, the perpendicular to the first end surface corresponds with the c-axis).

Figure 2A:
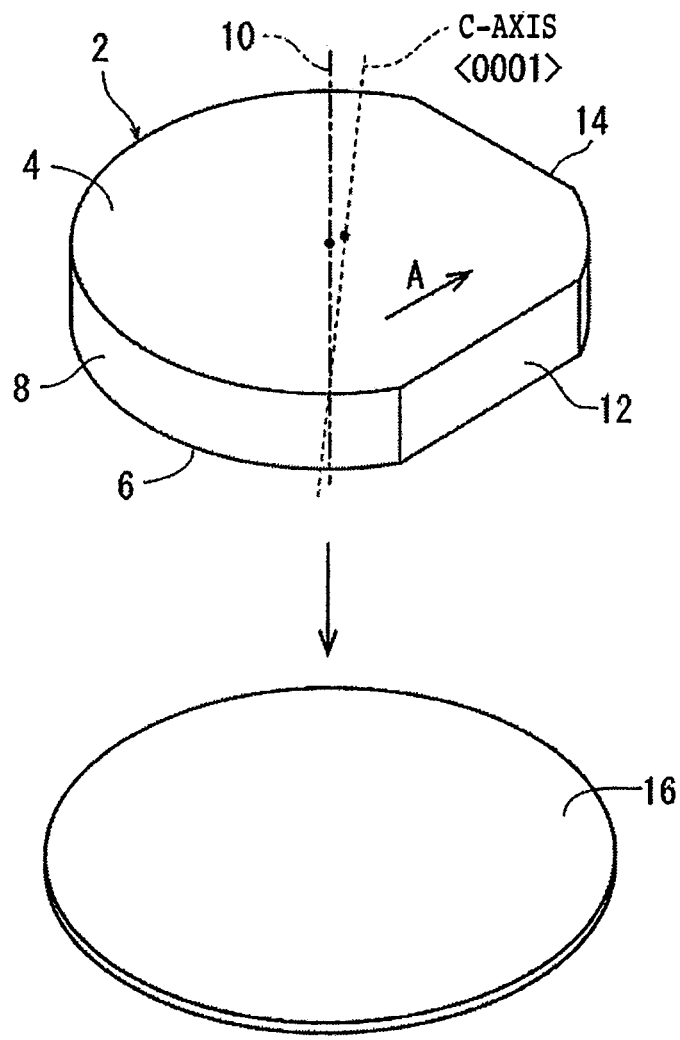
FIG. 2A is a perspective view of the SiC ingot and a substrate.
Figure 2B:
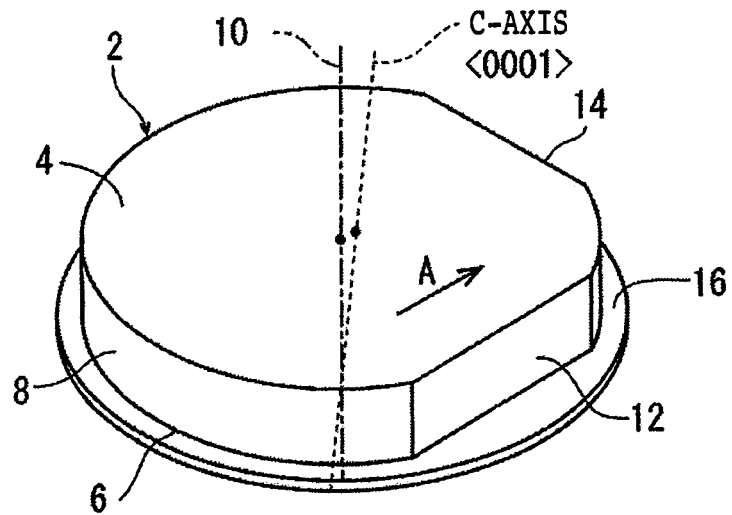
FIG. 2B is a perspective view depicting the state in which the substrate is mounted to the SiC ingot.

The planarization method according to the present invention is a planarization method in which a separation layer in which SiC is separated into Si and carbon (C) and cracks are isotropically generated in the c-plane is formed at a depth corresponding to a wafer that should be generated from an end surface of an SiC ingot and the separation surface of the SiC ingot after the wafer that should be generated is separated is planarized. Therefore, prior to explanation of the planarization according to the present invention, a description will be made about forming a separation layer in the SiC ingot 2 and separating a wafer that should be generated. In the present embodiment, first, as depicted in FIG. 2, a substrate 16 with a circular disc shape is mounted to the second end surface 6 of the SiC ingot 2 with the intermediary of an appropriate adhesive. The purpose of mounting the substrate 16 to the SiC ingot 2 is to suck and hold the SiC ingot 2 in which the first orientation flat 12 and the second orientation flat 14 are formed with a predetermined suction force by a circular suction adhesion chuck of each piece of apparatus to be described later. The diameter of the substrate 16 is slightly larger than the diameter of the suction adhesion chuck of each piece of apparatus to be described later. Thus, the suction adhesion chuck is covered by the substrate 16 when the SiC ingot 2 is placed over the suction adhesion chuck with the substrate 16 oriented downward. Therefore, the SiC ingot 2 in which the first orientation flat 12 and the second orientation flat 14 are formed can be held by suction with the predetermined suction force by the suction adhesion chuck. If the diameter of the SiC ingot 2 is larger than the suction adhesion chuck and the whole of the upper surface of the suction adhesion chuck is covered by the SiC ingot 2 when the SiC ingot 2 is placed on the suction adhesion chuck, air is not sucked from the exposed part of the suction adhesion chuck in suction by the suction adhesion chuck and suction adhesion of the SiC ingot 2 can be carried out with the predetermined suction force by the suction adhesion chuck. Therefore, the substrate 16 does not have to be mounted to the SiC ingot 2.

After the substrate 16 is mounted to the SiC ingot 2, the focal point of a laser beam with such a wavelength as to be transmitted through SiC is positioned at a depth corresponding to the wafer that should be generated from the end surface of the SiC ingot 2 and the SiC ingot 2 is irradiated with the laser beam to form a separation layer in which SiC is separated into Si and C and cracks are isotropically generated in the c-plane. The formation of the separation layer can be carried out by using laser processing apparatus 18 partly depicted in FIGS. 4A and 4B. The laser processing apparatus 18 includes a circular chuck table 20 that holds the SiC ingot 2, and a condenser 22 (see FIG. 4) that irradiates the SiC ingot 2 held by the chuck table 20 with a pulse laser beam LB. A porous suction adhesion chuck 24 connected to a suction unit (not depicted) is disposed at the upper end part of the chuck table 20. In the chuck table 20, a suction force is generated for the upper surface of the suction adhesion chuck by the suction unit and thereby the SiC ingot 2 placed on the upper surface is held by suction. Furthermore, the chuck table 20 is rotated by a motor for the chuck table (not depicted) in such a manner that an axial line that passes through the center of the chuck table 20 in the radial direction and extends along the upward-downward direction is the center of rotation. The condenser 22 includes a collecting lens (not depicted) for collecting the pulse laser beam LB that is oscillated by a pulse laser oscillator (not depicted) of the laser processing apparatus 18 and is emitted from the pulse laser oscillator, and for irradiating the SiC ingot 2 with the pulse laser beam LB. Furthermore, the condenser 22 is caused to advance and retreat in an X-axis direction (direction depicted by an arrow X in FIG. 4) by an X-axis direction movement unit (not depicted). In addition, the condenser 22 is caused to advance and retreat in a Y-axis direction (direction depicted by an arrow Y in FIG. 4) orthogonal to the X-axis direction by a Y-axis direction movement unit (not depicted). The plane defined by the X-axis direction and the Y-axis direction is substantially horizontal.

Figure 3:
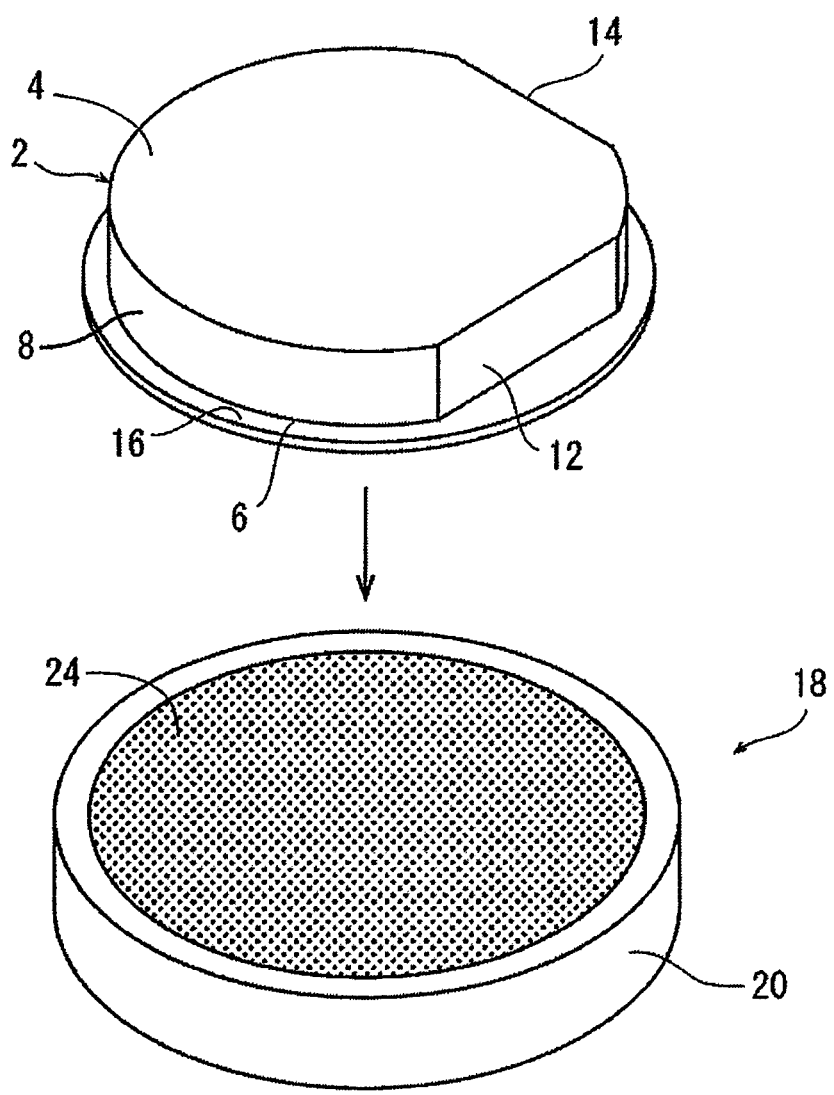
FIG. 3 is a perspective view depicting the state in which the SiC ingot is placed over a chuck table of laser processing apparatus.
Figure 4A:
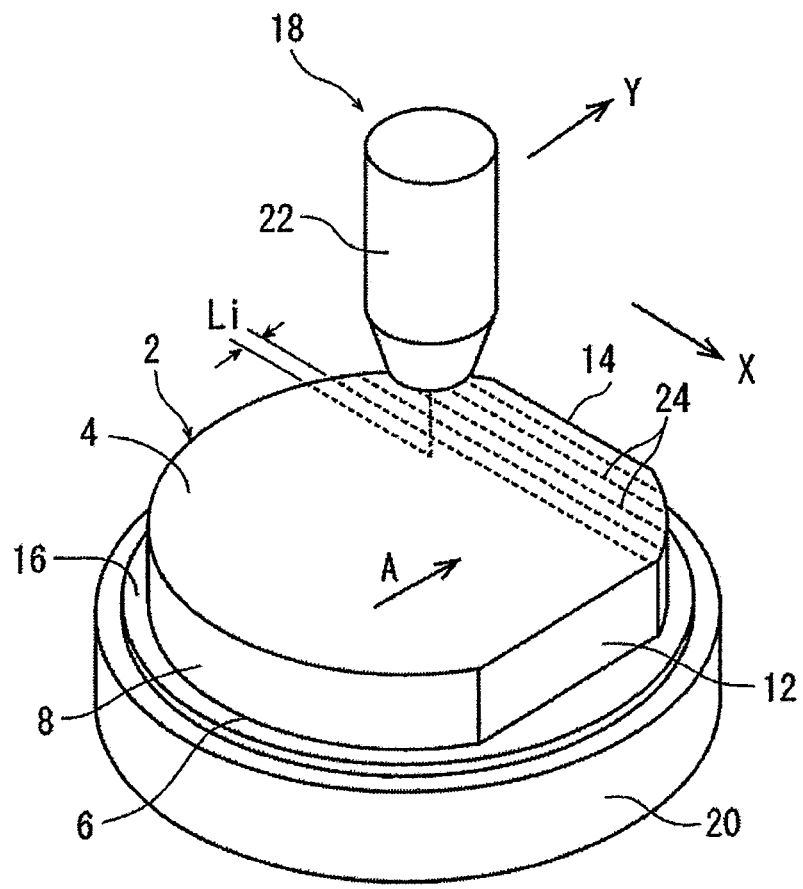
FIG. 4A is a perspective view depicting the state in which a separation layer forming step is being carried out.

When the separation layer is formed in the SiC ingot 2, as depicted in FIG. 3, first the SiC ingot 2 is placed over the upper surface of the chuck table 20 with the substrate 16 oriented downward. Subsequently, the suction unit connected to the suction adhesion chuck 24 is actuated to generate a suction force for the upper surface of the suction adhesion chuck, and the SiC ingot 2 is held by suction by the chuck table 20 from the side of the substrate 16. Subsequently, the SiC ingot 2 is imaged from above by an imaging unit (not depicted) of the laser processing apparatus 18. Subsequently, based on an image of the SiC ingot 2 obtained by imaging by the imaging unit, the chuck table 20 is rotated and the condenser 22 is moved. Thereby, the orientation of the SiC ingot 2 is adjusted to a predetermined orientation and the positions of the SiC ingot 2, and the condenser 22 in the XY plane are adjusted. When the orientation of the SiC ingot 2 is adjusted to the predetermined orientation, as depicted in FIG. 4A, by aligning the second orientation flat 14 with the X-axis direction, the direction orthogonal to direction A in which the off-angle α is formed is aligned with the X-axis direction, and direction A in which the off-angle α is formed is aligned with the Y-axis direction.

Figure 4B:
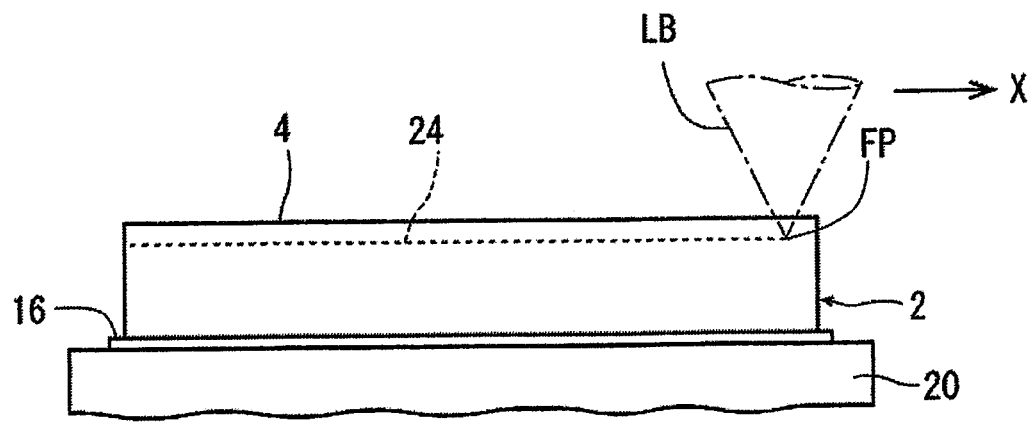
FIG. 4B is a front view depicting the state in which the separation layer forming step is being carried out.
Figure 5A:
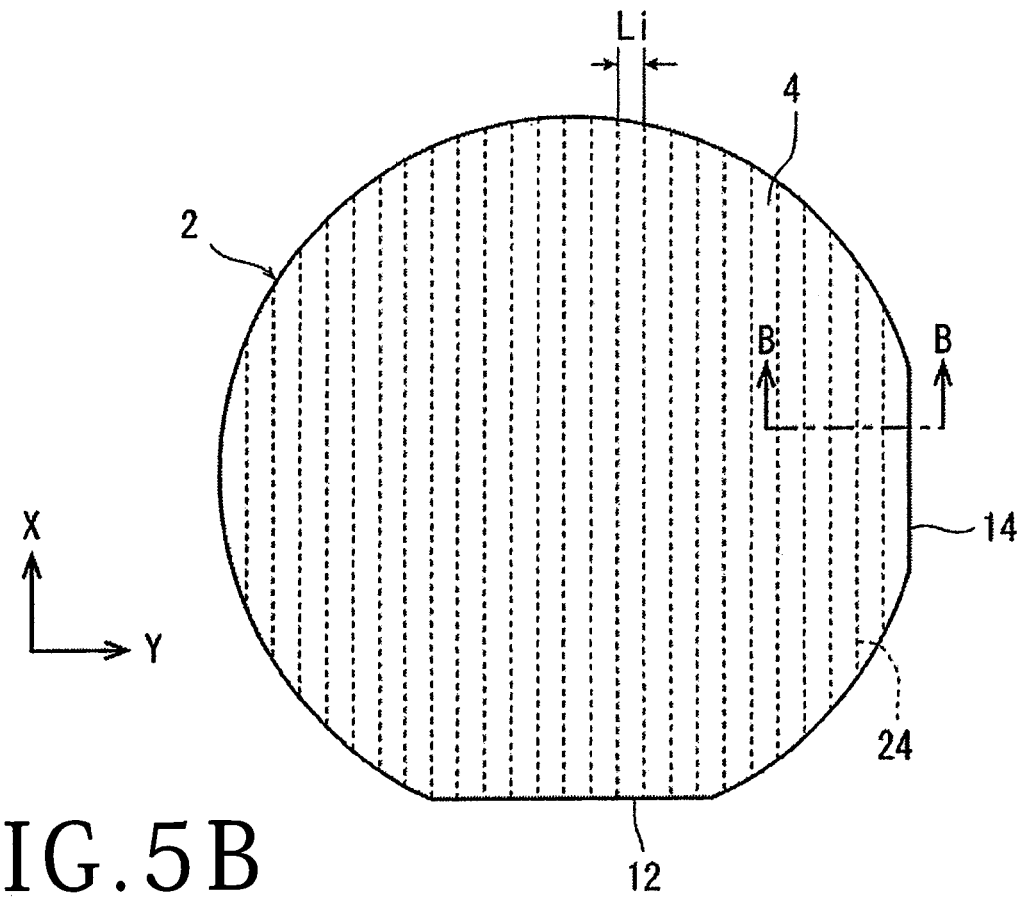
FIG. 5A is a plan view of the SiC ingot in which a separation layer is formed.
Figure 5B:
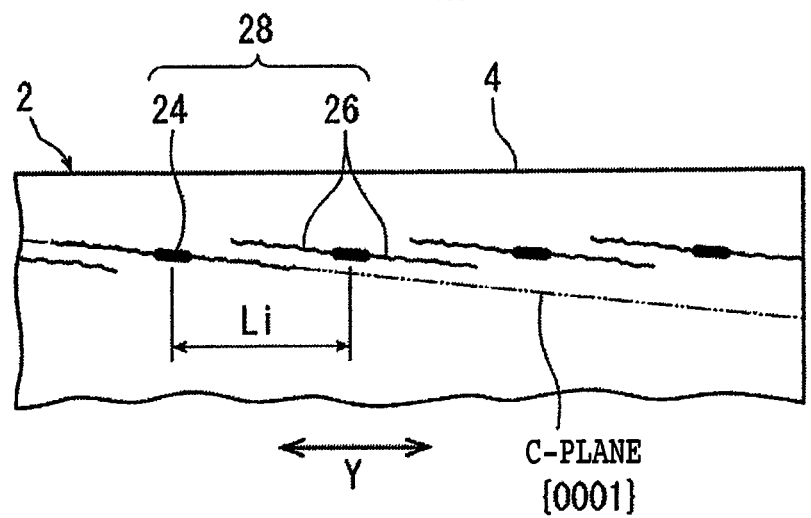
FIG. 5B is a sectional view along line B-B in FIG. 5A.

Subsequently, the condenser 22 is moved up or down by a focal point position adjustment unit (not depicted) and, as depicted in FIG. 4B, a focal point FP is positioned at a depth (for example, 300 μm) corresponding to the thickness of the wafer that should be generated from the first end surface 4 of the SiC ingot 2. Subsequently, separation layer forming processing of irradiating the SiC ingot 2 with the pulse laser beam LB with such a wavelength as to be transmitted through SiC from the condenser 22 while moving the condenser 22 at a predetermined feed speed in the X-axis direction aligned with the direction orthogonal to direction A in which the off-angle α is formed is carried out. When the separation layer forming processing is carried out, as depicted in FIGS. 5A and 5B, SiC is separated into Si and C due to the irradiation with the pulse laser beam LB and the pulse laser beam LB with which irradiation is carried out next is absorbed by the previously-formed C, so that SiC is separated into Si and C in a chain reaction and thereby a modified layer 24 is formed. This modified layer 24 is continuously formed in the direction orthogonal to direction A in which the off-angle α is formed. In addition, cracks 26 that isotropically extend along the c-plane from the modified layer 24 are generated. In carrying out the separation layer forming processing, the chuck table 20 may be moved in the X-axis direction at the predetermined feed speed instead of the condenser 22.

The description will be continued below with reference to FIGS. 4 to 5B. Subsequently to the separation layer forming processing, the condenser 22 is moved by the Y-axis direction movement unit to carry out indexing feed of the SiC ingot 2 and the focal point FP relatively in the Y-axis direction aligned with direction A in which the off-angle α is formed by a predetermined indexing amount Li (for example, 250 to 400 μm) within a range that does not exceed the width of the cracks 26. In the indexing feed, the chuck table 20 may be moved instead of the condenser 22. Furthermore, by alternately repeating the separation layer forming processing and the indexing feed, plural modified layers 24 that continuously extend along the direction orthogonal to direction A in which the off-angle α is formed are formed at intervals of the predetermined indexing amount Li in direction A in which the off-angle α is formed. In addition, the cracks 26 that isotropically extend along the c-plane from the modified layers 24 are sequentially generated to cause the cracks 26 adjacent in direction A in which the off-angle α is formed to overlap as viewed in the upward-downward direction. Thereby, at the depth corresponding to the thickness of the wafer that should be generated from the first end surface 4 of the SiC ingot 2, a separation layer 28 that is composed of the plural modified layers 24 and the cracks 26 and at which the strength for separating the wafer from the SiC ingot 2 is lowered can be formed. To form the separation layer 28, the separation layer forming processing can be carried out under the following processing condition, for example.

| | |
|---|---|
| Wavelength of pulse laser beam | 1064 nm |
| Repetition frequency | 60 kHz |
| Average output power | 1.5 W |
| Pulse width | 4 ns |
| Diameter of focal point | 3 μm |
| Numerical aperture (NA) of collecting lens | 0.65 |
| Feed speed | 800 mm/s |

After the separation layer 28 is formed in the SiC ingot 2, the wafer that should be generated is separated from the SiC ingot 2 by using the separation layer 28 as the point of origin. The separation of the wafer can be carried out by using separating apparatus 30 partly depicted in FIGS. 6 and 7, for example. The separating apparatus 30 includes a circular chuck table 32 that holds the SiC ingot 2 and a separating unit 34 that holds the upper surface of the SiC ingot 2 held by the chuck table 32 and separates the wafer from the SiC ingot 2 by using the separation layer 28 as the point of origin. The chuck table 32 holds the SiC ingot 2 by suction at the upper surface, similarly to the chuck table 20 of the laser processing apparatus 18. The separating unit 34 includes a liquid bath 36 that houses a liquid in cooperation with the chuck table 32 when the wafer is separated from the SiC ingot 2. The liquid bath 36 configured to be freely moved up and down has a circular top wall 38 and a sidewall 40 that droops from the circumferential edge of the top wall 38 and has a circular cylindrical shape, and the lower end side thereof is opened. A liquid supply part 42 that makes the outside and inside of the liquid bath 36 communicate with each other is annexed to the top wall 38 and the liquid supply part 42 is connected to a liquid supply unit (not depicted) by a flow path. The outer diameter of the sidewall 40 is set equal to or smaller than the diameter of the chuck table 32 and the lower end of the sidewall 40 gets contact with the upper surface of the chuck table 32 when the liquid bath 36 is moved down. Furthermore, a ring-shaped packing 44 is annexed to the lower end of the sidewall 40. Moreover, when the liquid bath 36 is moved down to bring the lower end of the sidewall 40 into tight contact with the upper surface of the chuck table 32, a liquid housing space 46 is defined by the upper surface of the chuck table 32 and the inner surface of the liquid bath 36. A liquid 48 supplied from the liquid supply unit to the liquid housing space 46 through the liquid supply part 42 is prevented from leaking from the liquid housing space 46 by the packing 44.

Figure 6:
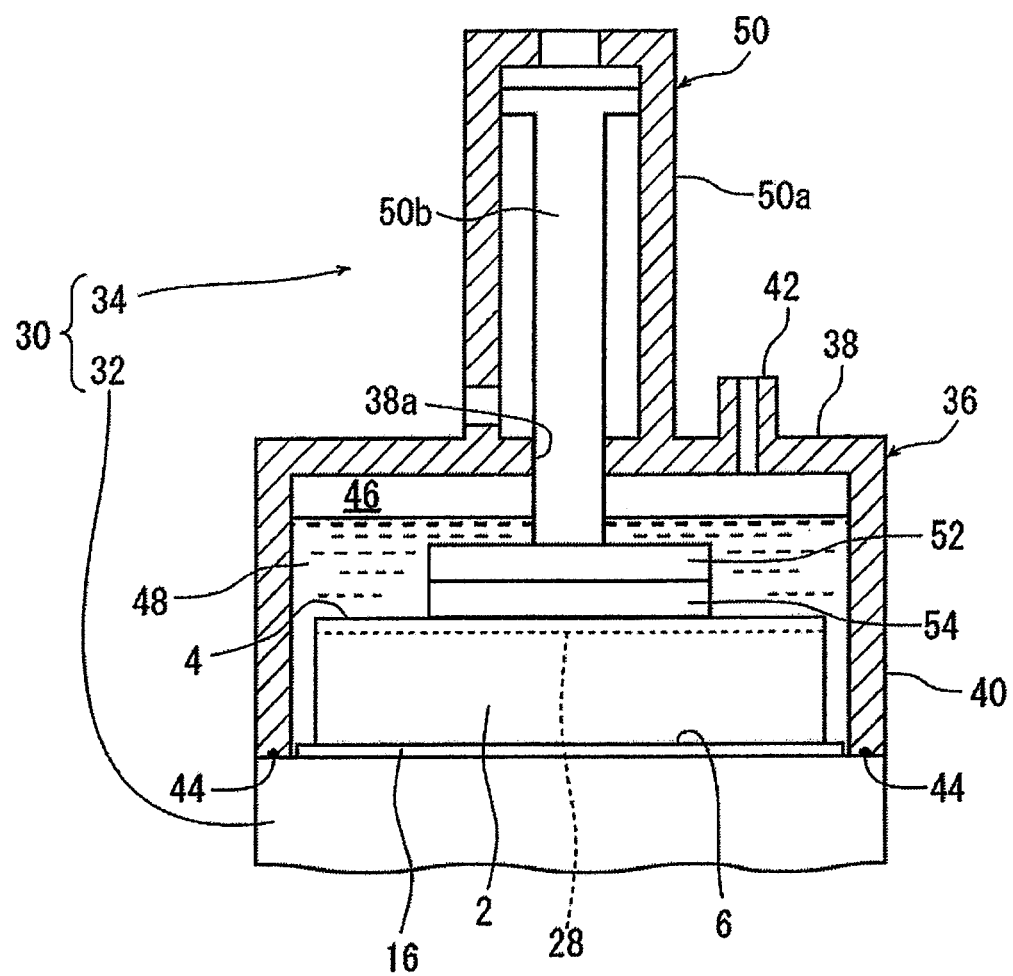
FIG. 6 is a sectional view of separating apparatus.
Figure 7:
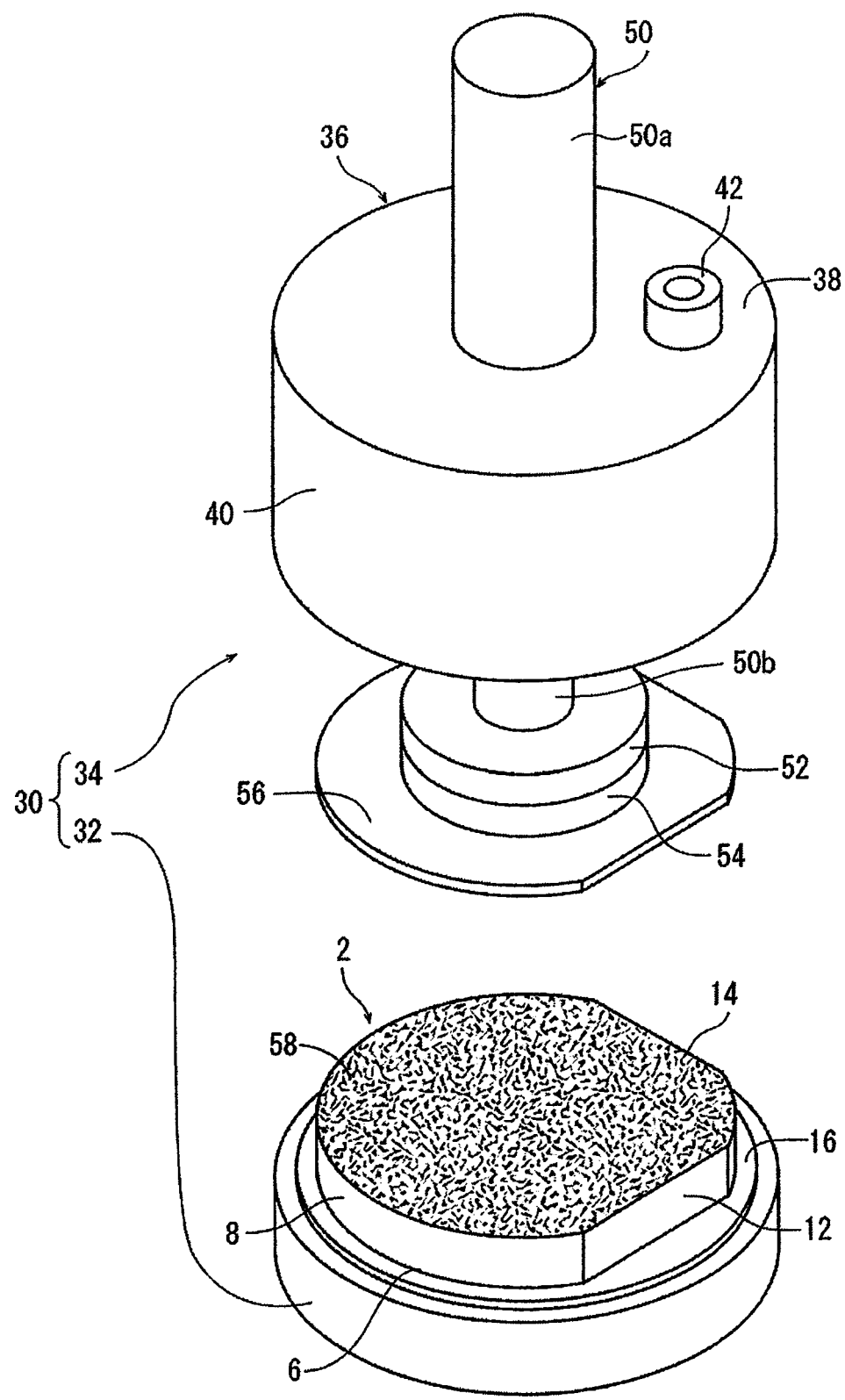
FIG. 7 is a perspective view depicting the state in which a wafer has been separated from the ingot by the separating apparatus.

As depicted in FIGS. 6 and 7, an air cylinder 50 is mounted to the top wall 38 of the liquid bath 36 and a cylinder tube 50a of the air cylinder 50 extends upward from the upper surface of the top wall 38. A lower end part of a piston rod 50b of the air cylinder 50 passes through a through-opening 38a of the top wall 38 and protrudes to the lower side of the top wall 38. A circular ultrasonic oscillating member 52 that can be formed from piezoelectric ceramics or the like is fixed to the lower end part of the piston rod 50*b*. A circular suction adhesion piece 54 is fixed to the lower surface of this ultrasonic oscillating member 52. The suction adhesion piece 54 having plural suction holes (not depicted) formed in the lower surface is connected to a suction unit (not depicted) by a flow path. By generating a suction force for the lower surface of the suction adhesion piece 54 by the suction unit, the suction adhesion piece 54 can hold the SiC ingot 2 by suction.

When the wafer is separated from the SiC ingot 2, first a suction force is generated for the upper surface of the chuck table 32 and the SiC ingot 2 is held by suction by the chuck table 32 from the side of the substrate 16. Subsequently, as depicted in FIG. 6, the liquid bath 36 is moved down by a lifting-lowering unit (not depicted), and the lower end of the sidewall 40 of the liquid bath 36 is brought into tight contact with the upper surface of the chuck table 32. Subsequently, the piston rod 50*b* of the air cylinder 50 is moved, and the lower surface of the suction adhesion piece 54 is brought into tight contact with the first end surface 4 of the SiC ingot 2. Subsequently, a suction force is generated for the lower surface of the suction adhesion piece 54, and the first end surface 4 is held by suction by the suction adhesion piece 54. Subsequently, the liquid 48 (for example, water) is supplied from the liquid supply part 42 to the liquid housing space 46 until the ultrasonic oscillating member 52 is immersed. Subsequently, by oscillating ultrasonic waves from the ultrasonic oscillating member 52, the separation layer 28 is stimulated and the cracks 26 are elongated to further lower the strength of the separation layer 28. Subsequently, by raising the liquid bath 36 in the state in which the SiC ingot 2 is held by suction by the suction adhesion piece 54, a wafer 56 that should be generated can be separated from the SiC ingot 2 by using the separation layer 28 as the point of origin as depicted in FIG. 7. A separation surface 58 of the SiC ingot 2 from which the wafer 56 has been separated has recesses and protrusions, and the height of the recesses and protrusions of the separation surface 58 is about 100 μm, for example. When ultrasonic waves are oscillated from the ultrasonic oscillating member 52, a gap (for example, 2 to 3 mm) may be made between the upper surface of the SiC ingot 2 and the lower surface of the suction adhesion piece 54.

As described above, after the separation layer 28 is formed in the SiC ingot 2 and the wafer 56 that should be generated is separated from the SiC ingot 2, a planarization method for planarizing the separation surface 58 of the SiC ingot 2 is carried out. In the planarization method, a grinding step of holding the opposite side to the separation surface 58 on a rotatable chuck table and rotating a grinding wheel having grinding abrasives in a ring manner to grind the separation surface 58 of the SiC ingot 2 held by the chuck table is included. The grinding step can be carried out by using grinding apparatus 60 partly depicted in FIG. 8A, for example. The grinding apparatus 60 includes a circular chuck table 62 that holds the SiC ingot 2 and a grinding unit 64 that grinds and planarizes the upper surface of the SiC ingot 2 held by the chuck table 62. Similarly to the chuck table 20 of the laser processing apparatus 18, the chuck table 62 holds the SiC ingot 2 by suction at the upper surface and is rotated by a motor for the chuck table (not depicted) around an axial line that passes through the center of the chuck table 62 in the radial direction and extends along the upward-downward direction. The grinding unit 64 includes a circular-column-shaped spindle 66 that is joined to a motor for the spindle (not depicted) and extends along the upward-downward direction, and a wheel mount 68 that is fixed to the lower end of the spindle 66 and has a circular disc shape. A ring-shaped grinding wheel 72 is fixed to the lower surface of the wheel mount 68 by bolts 70. To the outer circumferential edge part of the lower surface of the grinding wheel 72, plural grinding abrasives 74 disposed in a ring manner at intervals in the circumferential direction are fixed. In the grinding apparatus 60, the center of rotation of the grinding wheel 72 is displaced with respect to the center of rotation of the chuck table 62 in such a manner that the grinding abrasives 74 pass through the center of rotation of the chuck table 62. When the upper surface of the SiC ingot 2 held on the upper surface of the chuck table 62 and the grinding abrasives 74 get contact with each other while the chuck table 62 and the grinding wheel 72 mutually rotate, the whole upper surface of the SiC ingot 2 is ground by the grinding abrasives 74.

Figure 8A:
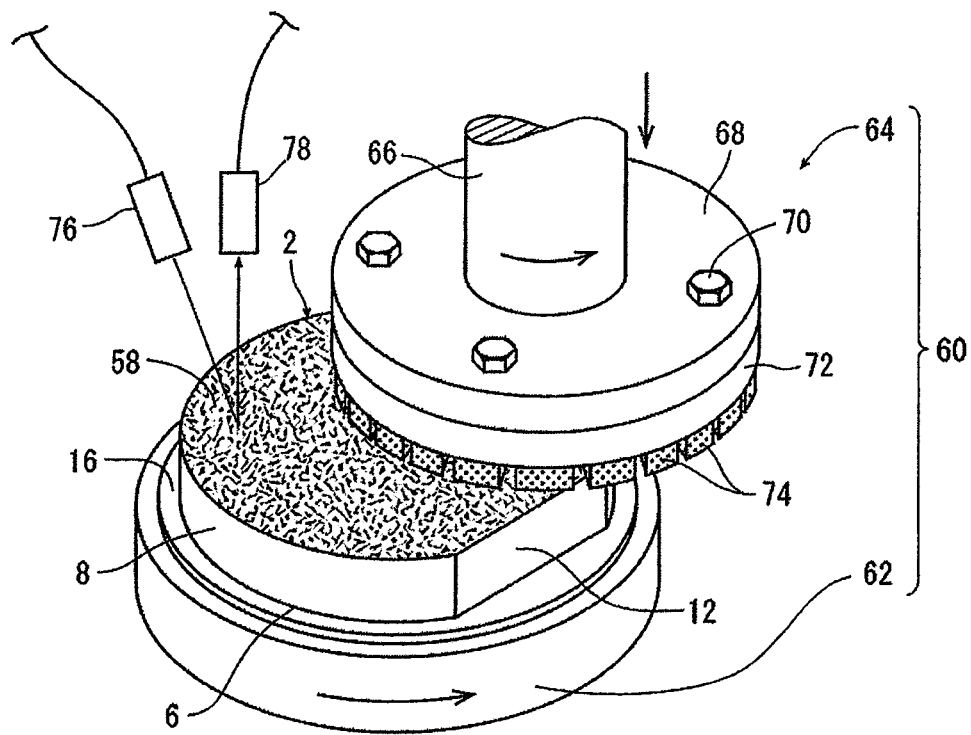
FIG. 8A is a perspective view depicting the state in which a flatness detection step is being carried out in conjunction with a grinding step.
Figure 8B:
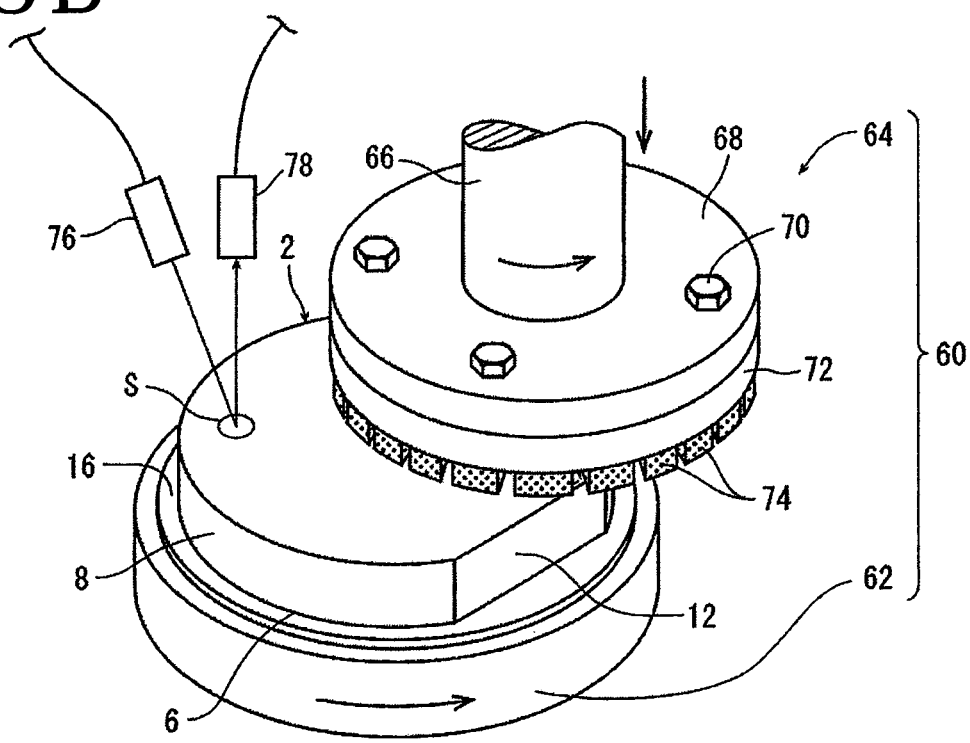
FIG. 8B is a perspective view depicting the state in which a separation surface of the SiC ingot has been planarized.

The description will be continued below with reference to FIGS. 8A and 8B. In the grinding step, first a suction force is generated for the upper surface of the chuck table 62 and the opposite side to the separation surface 58 in the SiC ingot 2 (side of the substrate 16) is held by suction by the chuck table 62. Subsequently, the chuck table 62 is rotated at a predetermined rotational speed (for example, 300 rpm) in an anticlockwise manner as viewed from above. Furthermore, the spindle 66 is rotated at a predetermined rotational speed (for example, 6000 rpm) in an anticlockwise manner as viewed from above. Subsequently, the spindle 66 is moved down by a lifting-lowering unit (not depicted) of the grinding apparatus 60, and the grinding abrasives 74 are brought into contact with the separation surface 58. Then, after the grinding abrasives 74 are brought into contact with the separation surface 58, the spindle 66 is moved down at a predetermined grinding feed speed (for example, 1.0 μm/s). This can grind and planarize the separation surface 58 of the SiC ingot 2 to such an extent that the incidence of the pulse laser beam LB is not hindered when the separation layer 28 is formed in the SiC ingot 2 again. When the separation surface 58 is ground, grinding water is supplied from a grinding water supply unit (not depicted) to the separation surface 58 and the grinding abrasives 74.

When the above-described grinding step is being carried out, a flatness detection step of irradiating the separation surface 58 of the SiC ingot 2 exposed from the grinding wheel 72 with light and detecting reflected light to detect the degree of flatness is carried out. When that the separation surface 58 has become flat is detected in the flatness detection step, the grinding step is ended. As depicted in FIGS. 8A and 8B, the flatness detection step can be carried out by using a light emitting element 76 that irradiates the separation surface 58 exposed from the grinding wheel 72 with light, a light receiving element 78 that receives reflected light obtained through the irradiation from the light emitting element 76 and reflection by the separation surface 58, and a grinding water removing unit (not depicted) that removes the grinding water at an irradiation position S (see FIG. 8B) at which the irradiation with the light of the light emitting element 76 is carried out in the separation surface 58. The grinding water removing unit includes a nozzle connected to a compressed air source and sprays compressed air from the nozzle toward the irradiation position S to remove the grinding water at the irradiation position S and expose the separation surface 58.

Figure 9A:
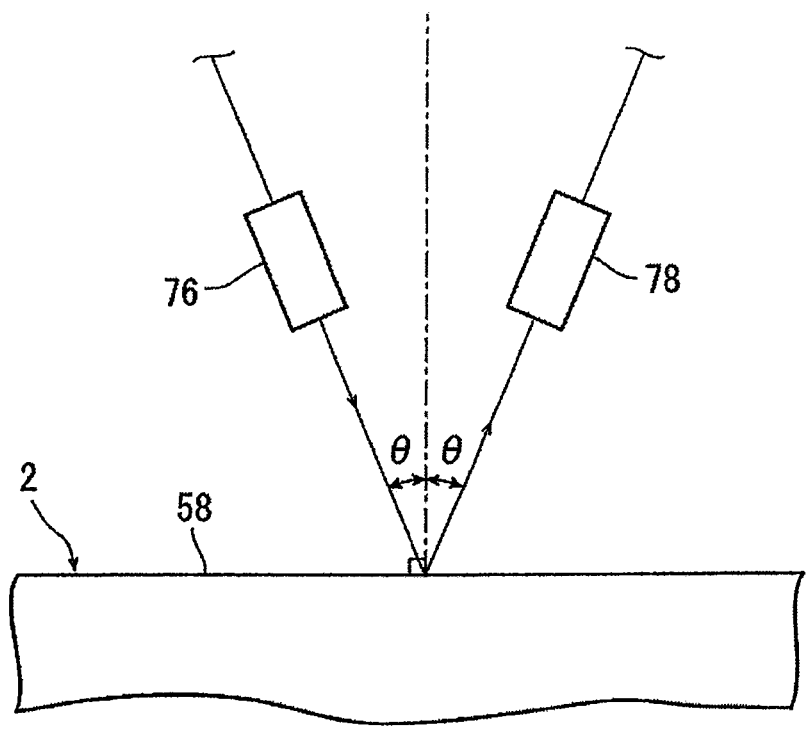
FIG. 9A is a schematic diagram depicting the state in which the separation surface is being irradiated with light at an incident angle θ and reflected light is being received at a reflection angle θ.
Figure 9B:
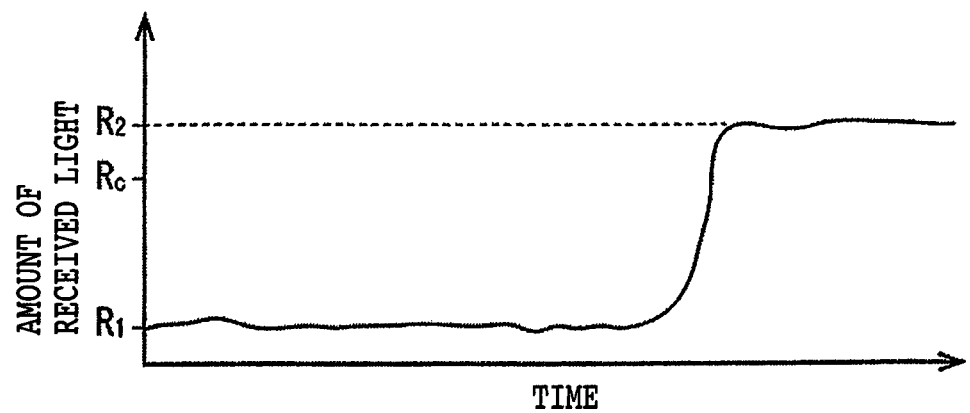
FIG. 9B is a graph depicting change in the amount of received light over time in the case of FIG. 9A.

In the flatness detection step, after the grinding water at the irradiation position S is removed and the separation surface 58 is exposed, when, as depicted in FIG. 9A, the separation surface 58 is irradiated with light from the light emitting element 76 at an incident angle θ and reflected light is received by the light receiving element 78 at a reflection angle θ and the amount of light received by the light receiving element 78 surpasses a threshold, that the separation surface 58 has become flat can be detected. Specifically, before the separation surface 58 has been planarized, the light with which the separation surface 58 is irradiated from the light emitting element 76 at the incident angle θ with respect to the separation surface 58 is diffusely reflected. Thus, the amount of reflected light reflected at the reflection angle θ is small and the amount of light received by the light receiving element 78 is small. However, when the separation surface 58 has been planarized, the reflected light reflected at the reflection angle θ increases from the reflected light before the planarization and the amount of light received by the light receiving element 78 increases. Thus, that the separation surface 58 has become flat can be detected when the amount of light received by the light receiving element 78 surpasses a threshold. As depicted in FIG. 9B, a threshold Rc can be arbitrarily set between an average R1 of the amount of received light before planarization and an average R2 of the amount of received light after planarization. However, it is preferable for the threshold Rc to be a value closer to the average R2 than the middle value between the average R1 and the average R2.

Figure 10A:
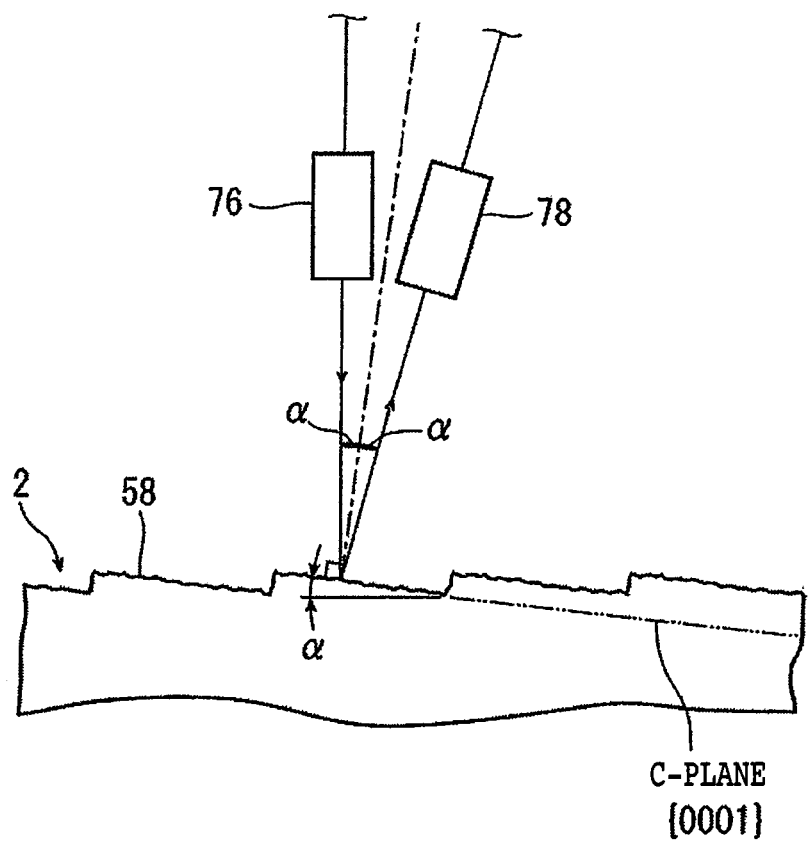
FIG. 10A is a schematic diagram depicting the state in which light is being emitted perpendicularly to the separation surface and reflected light is being received at a position with an angle of 2α from an irradiation position.
Figure 10B:
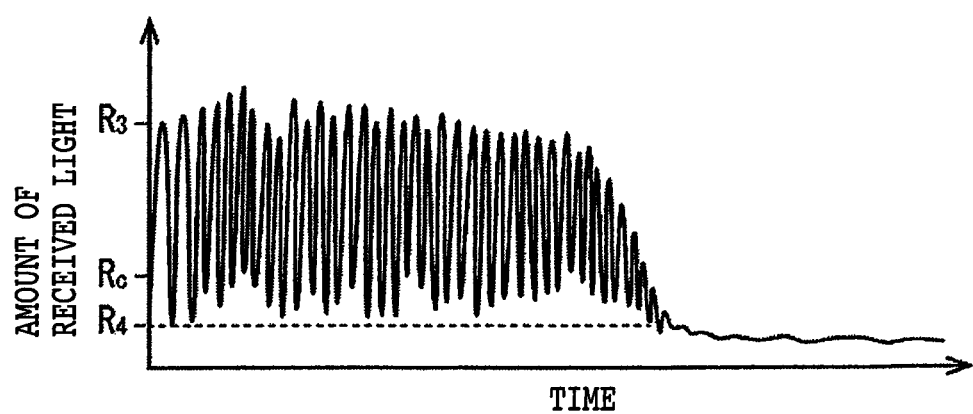
FIG. 10B is a graph depicting change in the amount of received light over time in the case of FIG. 10A.

Furthermore, if the wafer 56 that should be generated is separated from the separation layer 28 of the SiC ingot 2 in which the off-angle α is formed by the c-plane and the end surface (that is, the off-angle α is not 0 degrees), it is also possible to carry out the flatness detection step in the following manner. Specifically, when, as depicted in FIG. 10A, light is emitted from the light emitting element 76 perpendicularly to the separation surface 58 and reflected light is received by the light receiving element 78 at a position at which the angle formed with the light emitting element 76 is 2α and the amount of received light falls below a threshold, that the separation surface 58 has become flat is detected. Specifically, if the wafer 56 that should be generated is separated from the separation layer 28 of the SiC ingot 2 in which the off-angle α is formed by the c-plane and the end surface, the part that extends along the c-plane exists in the separation surface 58. Thus, the amount of light received by the light receiving element 78 disposed at the position at which the angle formed with the light emitting element 76 is 2α becomes comparatively large when the positional relationship depicted in FIG. 10A is satisfied in grinding of the separation surface 58. Thus, the amount of light fluctuates as depicted in FIG. 10B. Then, when the separation surface 58 has been planarized, the part that extends along the c-plane disappears in the separation surface 58. Thus, the amount of received light with the comparatively-large value intermittently detected becomes undetected. Therefore, when the amount of light received by the light receiving element 78 has fallen below the threshold (that is, the amount of received light equal to or larger than the threshold has become undetected), that the separation surface 58 has become flat can be detected. As depicted in FIG. 10B, the threshold Rc in this case can be arbitrarily set between an average R3 of the amount of received light with the comparatively-large value intermittently detected before planarization and an average R4 of the amount of received light after planarization. However, it is preferable for the threshold Rc to be a value closer to the average R4 than the middle value between the average R3 and the average R4. "Perpendicularly to the separation surface 58" in the above-described "light is emitted from the light emitting element 76 perpendicularly to the separation surface 58" means that the light is perpendicular to the flat separation surface 58 after grinding.

As described above, in the present embodiment, the planarization method includes the grinding step of holding the opposite side to the separation surface 58 in the SiC ingot 2 on the rotatable chuck table 62 and rotating the grinding wheel 72 having the grinding abrasives 74 in a ring manner to grind the separation surface 58 of the SiC ingot 2 held by the chuck table 62, and the flatness detection step of irradiating the separation surface 58 of the SiC ingot 2 exposed from the grinding wheel 72 with light and detecting reflected light to detect the degree of flatness. Because the grinding step is ended when that the separation surface 58 of the SiC ingot 2 has become flat is detected in the flatness detection step, the excessive grinding of the separation surface 58 can be avoided and the grinding time can be shortened.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A planarization method for planarizing a separation surface of a silicon carbide ingot after a focal point of a laser beam with such a wavelength as to be transmitted through silicon carbide is positioned at a depth corresponding to a wafer to be generated from an end surface of the silicon carbide ingot and the silicon carbide ingot is irradiated with the laser beam to form a separation layer in which silicon carbide is separated into silicon and carbon and cracks are isotropically generated along a c-plane, and the wafer is separated from the silicon carbide ingot at the separation layer, the planarization method comprising:
   a grinding step of holding an opposite side to the separation surface in the silicon carbide ingot by a rotatable chuck table and rotating a grinding wheel having a plurality of grinding abrasives disposed in a ring manner to grind the separation surface of the silicon carbide ingot held by the chuck table; and
   a flatness detection step of irradiating the separation surface of the silicon carbide ingot exposed from the grinding wheel with light and detecting reflected light to detect a degree of flatness, wherein:
   the grinding step is ended when it has been detected in the flatness detection step that the separation surface of the silicon carbide ingot has become flat,
   wherein:
   in the flatness detection step, detecting that the separation surface has become flat comprises irradiating the separation surface with the light at an oblique incident angle θ, and receiving the reflected light at an oblique reflection angle θ, and determining when an amount of received light surpasses a threshold, wherein said oblique incident angle θ is equal to said oblique reflection angle θ.

2. The planarization method according to claim 1, further comprising a grinding water removing step of spraying compressed air upon an area of the silicon carbide ingot in a vicinity of where the light is irradiated during the flatness detection step to thereby remove grinding water therefrom.

3. A planarization method for planarizing a separation surface of a silicon carbide ingot after a focal point of a laser beam with such a wavelength as to be transmitted through silicon carbide is positioned at a depth corresponding to a wafer to be generated from an end surface of the silicon carbide ingot and the silicon carbide ingot is irradiated with the laser beam to form a separation layer in which silicon carbide is separated into silicon and carbon and cracks are isotropically generated along a c-plane, and the wafer is separated from the silicon carbide ingot at the separation layer, the planarization method comprising:
- a grinding step of holding an opposite side to the separation surface in the silicon carbide ingot by a rotatable chuck table and rotating a grinding wheel having a plurality of grinding abrasives disposed in a ring manner to grind the separation surface of the silicon carbide ingot held by the chuck table; and
- a flatness detection step of irradiating the separation surface of the silicon carbide ingot exposed from the grinding wheel with light and detecting reflected light to detect a degree of flatness, wherein:
- the grinding step is ended when it has been detected in the flatness detection step that the separation surface of the silicon carbide ingot has become flat, wherein:
- if the wafer to be generated is separated from the separation layer of the silicon carbide ingot in which an off-angle $\alpha$ is formed by the c-plane and the end surface, in the flatness detection step, detecting that the separation surface has become flat comprises emitting the light from a light emitting element perpendicularly to the separation surface, receiving the reflected light at a position at which an angle formed with the light emitting element is $2\alpha$, and determining when an amount of received light falls below a threshold.

4. The planarization method according to claim 3, further comprising a grinding water removing step of spraying compressed air upon an area of the silicon carbide ingot in a vicinity of where the light is irradiated during the flatness detection step to thereby remove grinding water therefrom.

* * * * *